United States Patent [19]

Stucchi et al.

[11] Patent Number: 6,027,965
[45] Date of Patent: Feb. 22, 2000

[54] METHOD OF MANUFACTURING AN INTEGRATED CIRCUIT WITH MOS TRANSISTORS HAVING HIGH BREAKDOWN VOLTAGES, AND WITH PRECISION RESISTORS

[75] Inventors: Elena Stucchi, Cornate D'Adda; Stefano Daffra, Milan; Manlio Sergio Cereda, Lomagna, all of Italy

[73] Assignee: Stmicroelectronics S.r.l., Agrate Brianza, Italy

[21] Appl. No.: 09/067,126

[22] Filed: Apr. 27, 1998

[30] Foreign Application Priority Data

May 20, 1997 [EP] European Pat. Off. .............. 97830230

[51] Int. Cl.[7] ............................................... H01L 21/8234
[52] U.S. Cl. ........................... 438/238; 438/210; 438/382
[58] Field of Search .................................... 438/200, 210,
438/238, 381, 382, 383, 384, 385; 257/358, 359

[56] References Cited

U.S. PATENT DOCUMENTS

| 4,416,055 | 11/1983 | Mac Carthy et al. . | |
| 4,418,469 | 12/1983 | Fujita . | |
| 4,830,976 | 5/1989 | Morris et al. ............................. | 438/238 |
| 5,668,037 | 9/1997 | Prall et al. ............................... | 438/238 |

FOREIGN PATENT DOCUMENTS

| 0 455 376 A2 | 4/1991 | European Pat. Off. ........ H01L 21/82 |
| 0 534 872 A1 | 9/1992 | European Pat. Off. ......... H01L 27/08 |
| 0 545 363 A1 | 12/1992 | European Pat. Off. ...... H01L 21/329 |

OTHER PUBLICATIONS

Patent Abstracts of Japan, vol. 006, No. 009 (E–090), Jan. 20, 1982 and JP 56 130960A (Fujitsu Ltd), Oct. 14, 1981.
Patent Abstracts of Japan, vol. 009, No. 081 (E–307), Apr. 10, 1985 and JP 59 214250A (Toshiba KK), Dec. 4, 1984.

*Primary Examiner*—Tuan H. Nguyen
*Attorney, Agent, or Firm*—Theodore E. Galanthay; Allen, Dyer, Doppelt, Milbrath & Gilchrist, P.A.

[57] ABSTRACT

The method described provides for the formation of an implantation mask of polycrystalline silicon comprising strips for providing the gate electrodes of the MOS transistors and portions defining openings for the formation of resistors. The method further includes low-dose ionic implantation through the implantation mask to form pairs of regions at the sides of the gate strips and resistive regions through the openings, the formation of an insulating layer on the entire structure thus produced, and anisotropic etching of the insulating layer so as to uncover the areas of the substrate not covered by the polycrystalline silicon mask, but leaving a residue of insulating material along the edges of the gate strips. To compensate for the removal of a surface layer from the resistive regions due to the anisotropic etching, a second low-dose implantation is carried out without masking of the substrate, with a dose and an energy such as to produce a predetermined resistivity for the resistive regions without altering the resistivities of the source and drain regions of the MOS transistors.

19 Claims, 1 Drawing Sheet

METHOD OF MANUFACTURING AN INTEGRATED CIRCUIT WITH MOS TRANSISTORS HAVING HIGH BREAKDOWN VOLTAGES, AND WITH PRECISION RESISTORS

FIELD OF THE INVENTION

The present invention relates to the manufacture of semiconductor devices, and, more particularly, to the manufacture of MOS integrated circuits including MOS transistors and resistors on a substrate of semiconductor material.

BACKGROUND OF THE INVENTION

A conventional method of producing both MOS transistors having relatively high drain-junction breakdown voltages, and precision resistors, in an integrated circuit, provides for the use of a single polycrystalline silicon mask and a single implantation step to produce together a weakly doped zone of the drain region and a high-resistivity region for the resistor. As will be explained in greater detail below, this method requires the formation of a silicon dioxide layer on the polycrystalline silicon mask and anisotropic etching of this layer throughout its area to add a masking border to the gate strips before the usual high-dose implantation of the source and drain regions. For this operation to be effective, the etching has to be continued until a thin surface layer has been removed from the uncovered regions of the semiconductor material. The semiconductor material is normally monocrystalline silicon, and which provides the substrate. This causes a depletion of the doping of these regions, and, hence, an increase in their resistivity. This increase in resistivity does not appreciably affect the final characteristics of the transistors, but considerably affects the values of the resistors.

Since, to ensure correct operation of the integrated circuit, the values of the resistors must not differ from the design values, the over-etching may adversely affect the electrical characteristics of the circuit or may render the design more complex since it requires certain compensation circuitry. In any case, apart from the over-etching problem, the known method renders the breakdown voltage of the MOS transistors and the resistances of the precision resistors interdependent. Moreover, in certain cases this provides a considerable limitation on the design of the circuit.

One possible approach to this problem is to use two separate masks and two separate implantation steps to form the MOS transistors with high breakdown voltages and to form the precision resistors. However, this approach complicates the manufacturing process with a consequent increase in the number of defects in the resulting integrated circuits, and, hence, a reduction in production output.

SUMMARY OF THE INVENTION

The object of the present invention is to provide a method of the type defined above which prevents the problems described above without appreciably complicating the manufacturing process and, particularly, without increasing the number of defects in the resulting integrated circuits.

This and other objects, features and advantages in accordance with the present invention are provided by a method of manufacturing an integrated circuit comprising MOS transistors and resistors on a substrate of semiconductor material having a first conductivity type. The method preferably comprises the steps of: (a) forming a dielectric layer on a substrate defining gate dielectrics of the MOS transistors; (b) forming a polycrystalline silicon layer on the dielectric layer; (c) selectively removing portions of the polycrystalline layer to define an implantation mask comprising portions of polycrystalline silicon intended to form respective gate electrodes of the MOS transistors and to form portions which define resistor openings; (d) subjecting the substrate to a first implantation through the implantation mask with dopant ions at a relatively low dose to form, in the substrate on opposite sides of each gate-electrode, a pair of regions with a second type of conductivity separated from one another, and to form, through each of the resistor openings, a resistive region with the second type of conductivity; and (e) forming a layer of insulating material which covers a structure resulting from steps (a) through (d).

Moreover, the method also preferably further comprises the steps of: (f) subjecting the layer of insulating material to anisotropic etching to remove the insulating material until areas of the substrate not covered by the implantation mask are uncovered, and leaving a residue of insulating material along edges of the polycrystalline silicon so as to produce a modified implantation mask; (g) subjecting the substrate after step (f) to a second implantation through the modified implantation mask with dopant ions at a relatively low dose such as to produce a predetermined surface resistivity for the resistive regions; and (h) subjecting the substrate selectively to further implantation of dopant ions at a relatively high dose.

The relatively low dose in step (g) may be on the order of about $10^{12}$ ions/cm$^2$, and the relatively high dose in step (h) may be on the order of about $10^{15}$ ions/cm$^2$. In addition, the method may also include the steps of measuring recesses in insulating or field oxide portions as a result of the anisotropic etching of step (f), and determining the dose and the energy to be used in step (g) based upon the measuring.

BRIEF DESCRIPTION OF THE DRAWINGS

The invention will be understood better from the following detailed description of embodiments thereof, given by way of example with reference to the appended drawings, in which.

DETAILED DESCRIPTION OF THE PREFERRED EMBODIMENTS

Figure 1:
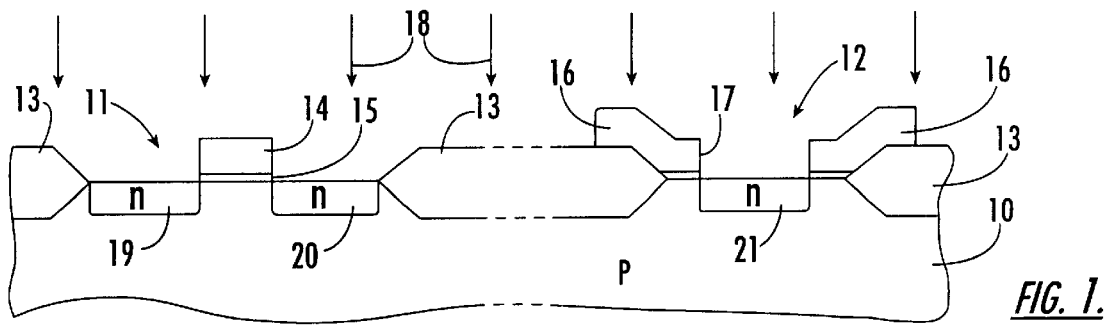
FIGS. 1 to 5 show, in section and partially, a silicon substrate in various stages of the method according to the invention.

FIG. 1 shows a portion of a monocrystalline silicon substrate 10 having p-type conductivity. This portion contains, on the principal surface of the substrate, two portions which define two so-called active areas 11 and 12 which are insulated from one another and from other areas of the surface of the substrate by silicon dioxide portions 13, that is, the so-called field oxide. One of the areas, that is, the left-hand one, indicated 11 in the drawing, is intended to contain one or more MOS field-effect transistors, in this example, only one. The other area, indicated 12, is intended to contain a precision resistor.

A strip 14 of doped polycrystalline silicon 14 is formed on the active area 11 and is separated from the surface of the substrate by a thin strip 15 of silicon dioxide. These strips 14 and 15 provide, respectively, the gate electrode and the gate dielectric of the MOS field-effect transistor. Polycrystalline silicon portions 16 define an opening 17 for the formation of a resistor on the active area 12.

The structure shown in FIG. 1 is produced by known techniques comprising:

localized growth of silicon dioxide to form the field oxide portions 13 on the principal surface of the substrate 10, high-temperature oxidation to form a thin layer of silicon dioxide, such as the strip 15, for the gate dielectrics, deposition of a layer of polycrystalline silicon on the silicon dioxide layer, formation of an implantation mask by the selective removal of portions of the polycrystalline silicon and of the underlying thin layer of silicon dioxide by known photolithography operations so as to leave on the substrate the strips 14 and 15 which provide the gate electrode and dielectric of the MOS transistor and the portions 16 which define the opening 17 for the resistor, and implantation of phosphorus ions, represented by arrows 18, with a low dose, for example, on the order of $10^{13}$ ions/cm$^2$, and with an energy of 50–80 KeV to form three n-type conductivity regions. Two, indicated 19 and 20, are on either side of the gate strip 14, 15, and one, indicated 21, is across the area 12 intended for the resistor. These are formed with the use of the polycrystalline silicon implantation mask produced by the selective removal step described above.

It should be noted that it is also possible not to remove the thin silicon dioxide layer which serves to form the gate dielectric 15 from the surface of the substrate since it does not provide a barrier to the implantation. In fact, in many cases, it is preferred to leave it in position, since it reduces surface damage due to implantation.

Figure 2:
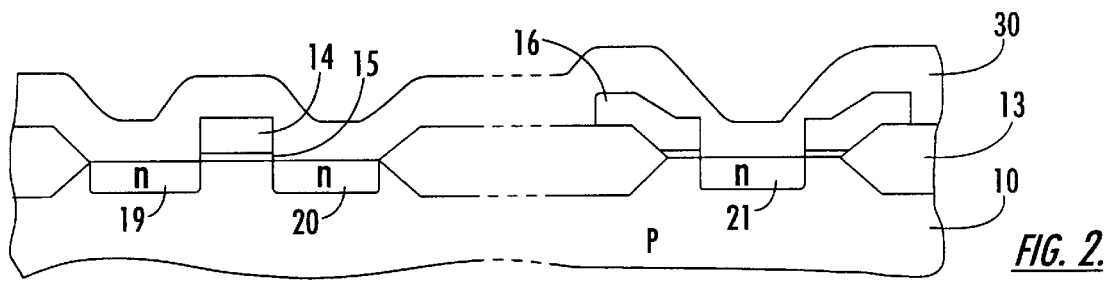

The structure resulting from the steps described above is covered, in a conventional manner, by a layer 30 of insulating material, for example, silicon dioxide, by low-temperature vapor-phase deposition, as shown in FIG. 2. The layer 30 is then subjected to anisotropic etching, for example, plasma etching, throughout its area, that is, without any mask. The etching time calculated is such that the silicon dioxide is removed until the areas of the substrate 10 which are not covered by the polycrystalline silicon are uncovered.

Figure 3:
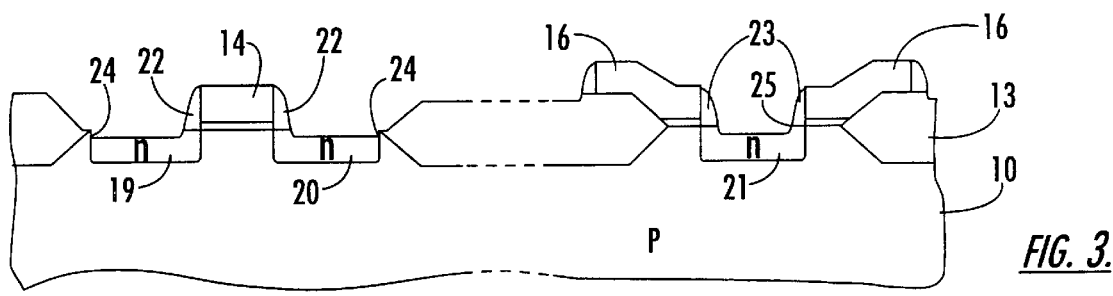

As a result of the anisotropic etching, there are silicon dioxide residues along the edges of the polycrystalline silicon mask, as shown in FIG. 3. These residues are indicated 22 along the edges of the gate strip 14 and 23 along the edges of the portion which defines the opening 17 for the resistor.

As is also known, to ensure that the silicon dioxide is removed completely from the monocrystalline silicon of the substrate and to define a clear boundary between the residues 22 and the surface of the substrate, the etching is continued until a thin layer, for example, 10–20 nm of silicon is removed. Recesses 24 and 25 are thus produced, as shown in FIG. 3, in the regions 19 and 20 which are to provide the source and drain regions, and in the region 21 which is to provide the resistor. The silicon dioxide portions 13 are also recessed by this step, but this does not affect the electrical characteristics of the circuit components being produced.

According to the prior art, at this point, the method would continue with the various selective ion-implantation steps with the use of suitable masks to introduce into the substrate high doses, that is, on the order of $10^{15}$ ions/cm$^2$ of n-type and p-type dopants to form n-channel and p-channel MOS transistors. In particular, the structure shown in FIG. 3 could be masked completely during the high-dose implantation steps so as to keep the resistivities of the regions 19, 20 and 21 unchanged. In this case, upon completion of the manufacturing process an n-channel MOS transistor with a high breakdown voltage with a relatively high series resistance, and a resistor with high resistivity would be produced, with the problems mentioned in the background of the invention.

The structure of FIG. 3 could also be masked solely on the region of the resistor and subjected to high-dose implantation of phosphorus ions. In this case, upon completion of the manufacturing process, an n-channel MOS transistor having source and drain regions each provided by a weakly doped zone under the silicon dioxide residue 22 and by a strongly doped zone on the rest of the region would be produced. Accordingly, a transistor having a high breakdown voltage and low series resistance would be produced. Naturally, the resistor would be identical to that which could be produced by the previous process.

Figure 4:
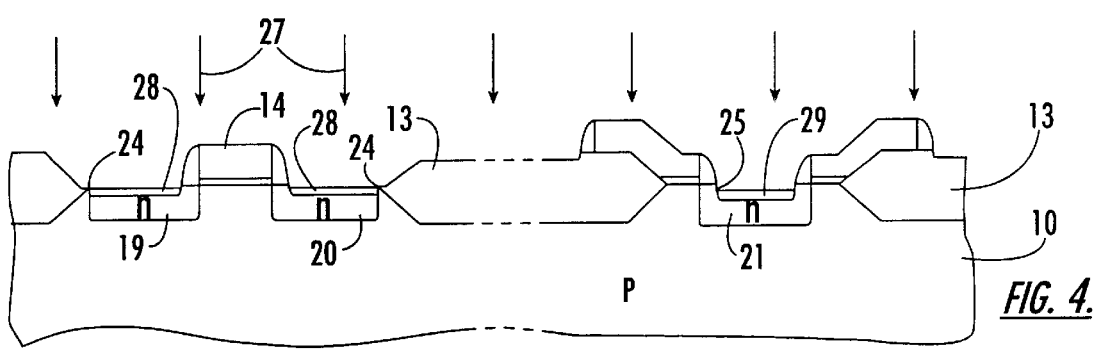

According to the invention, before or after the masking and high-dose implantation steps for forming the source and drain regions of the n-channel and p-channel transistors, and in any case after the anisotropic etching of the insulating layer 30, a second, low-dose implantation of phosphorus ions is carried out, for example, with a dose on the order of $10^{12}$ ions/cm$^2$ with an energy of 20–50 KeV, so as to achieve the desired resistivity in the region intended for the resistor. In this embodiment of the method of the invention, this second low-dose implantation is carried out before the masking and the high-dose implantations. The beams of phosphorus ions are shown by arrows 27 in FIG. 4 and have the effect of forming thin implanted regions 28 in the regions 19 and 20 of the transistor, and a thin implanted region 29 in the region 21 of the resistor.

Since this second implantation is also carried out on the regions which are to become the source and drain regions of all of the MOS transistors of the integrated circuit, the dose and the energy used, according to the invention, has to be such as not to alter significantly the surface resistivities of these regions, and, hence, the electrical characteristics of the transistors upon completion of the method. The dose and the energy, in a method such as that described above should be on the order of $10^{12}$ ions/cm$^2$ and no greater than 60 KeV, respectively, to produce resistors with surface resistivities on the order of 1500–2500 ohms/square. The desired resistivity for the resistor may be that which it would have had if over-etching of the surface of the substrate had not been carried out, but it could also be greater or less than this value.

The implantation parameters (dose, energy) are determined experimentally by the measurement, preferably on a test structure subjected to the same processing, of the recessing of the field oxide due to the continuation of the anisotropic etching. This measurement gives a precise indication of the increase in the resistivity of the areas intended for the resistors, and, hence, the amount of compensation required.

Figure 5:
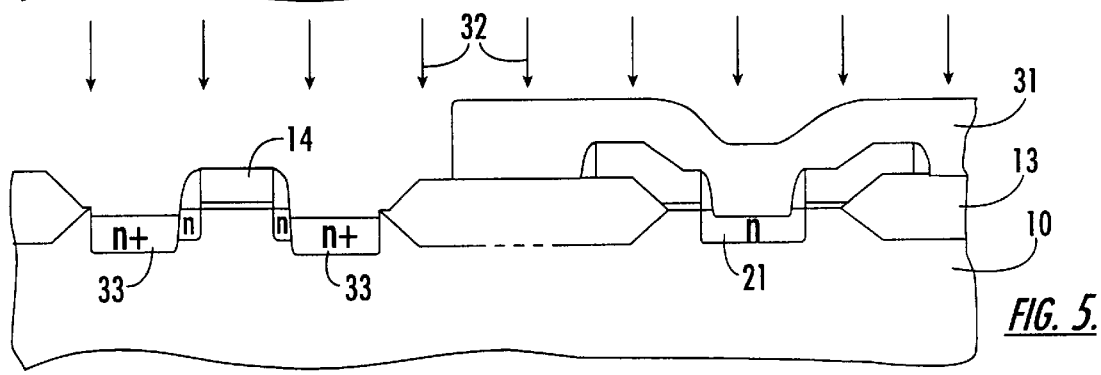

The method then continues with the usual masking and high-dose implantation steps to complete or form the source and drain regions of the n-channel and p-channel transistors with the usual heating processes for the diffusion of the dopants implanted and with the usual steps for the formation of interconnections and metal contacts and for final passivation. By way of illustration, FIG. 5 shows the structure of FIG. 4 with the portion intended for the resistor covered by a photoresist mask 31. The structure is subjected to high-dose implantation of phosphorus ions, indicated by arrows 32, which has the effect of forming strongly-doped regions 33 which complete the doping of the source and drain regions of a MOS transistor with a high breakdown voltage and with low series resistance.

It can easily be seen that, with the method according to the invention, the designs of the transistors with high breakdown voltages and of the high-resistivity precision resistors are rendered independent of one another without additional masking steps. For example, it is possible to achieve breakdown voltages higher than those which can be achieved by the known method, simply by reducing the dose of the first low-dose implantation and determining the resistivity of the resistor regions with the second low-dose implantation.

That which is claimed is:

1. A method of manufacturing an integrated circuit comprising MOS transistors and resistors on a substrate of semiconductor material having a first conductivity type, the method comprising the steps of:
   (a) forming a dielectric layer on a principal surface of the substrate for gate dielectrics of the MOS transistors;
   (b) forming a polycrystalline silicon layer on the dielectric layer;
   (c) selectively removing portions of the polycrystalline layer to define an implantation mask comprising portions of polycrystalline silicon each intended to form respective gate electrodes of the MOS transistors and to form portions which define resistor openings each intended for the formation of a respective resistor;
   (d) subjecting the principal surface of the substrate to a first implantation through the implantation mask with ions of a dopant of a predetermined type to form, in the substrate on two opposite sides of each gate electrode, a pair of regions with a second type of conductivity separated from one another by a channel, and to form, through each of the resistor openings, a resistive region with the second type of conductivity;
   (e) forming a layer of insulating material which covers a structure resulting from steps (a) through (d);
   (f) subjecting the layer of insulating material to anisotropic etching to remove the insulating material until areas of the substrate not covered by the implantation mask are uncovered, and leaving a residue of insulating material along edges of the polycrystalline silicon so as to produce a modified implantation mask;
   (g) subjecting the principal surface of the substrate after step (f) to a second implantation through the modified implantation mask with ions of a dopant of the predetermined type with a dose and an energy such as to produce a predetermined surface resistivity for the resistive regions; and
   (h) selectively subjects the principal surface of the substrate to further implantation.

2. A method according to claim 1, wherein step (g) comprises subjecting the principal surface of the substrate to the second implantation so as not to substantially alter surface resistivities of the regions selectively subjected to the further implantation.

3. A method according to claim 1, wherein step (g) is performed before step (h).

4. A method according to claim 1, wherein the second implantation in step (g) is about $10^{12}$ ions/cm$^2$.

5. A method according to claim 1, wherein the further implantation in step (h) is about $10^{15}$ ions/cm$^2$.

6. A method according to claim 1, further comprising the step of forming on the substrate areas insulated from one another by insulating portions to contain the MOS transistors and the resistors.

7. A method according to claim 6, further comprising the steps of:
   measuring recesses in the insulating portions as a result of the anisotropic etching of step (f); and
   determining the dose and the energy used in step (g) based upon the measuring.

8. A method of manufacturing an integrated circuit comprising MOS transistors and resistors on a substrate of semiconductor material, the method comprising the steps of;
   (a) forming a dielectric layer on a substrate defining gate dielectrics of the MOS transistors;
   (b) forming a polycrystalline silicon layer on the dielectric layer;
   (c) selectively removing portions of the polycrystalline layer to define an implantation mask comprising portions of polycrystalline silicon to form respective gate electrodes of the MOS transistors and to form portions which define resist or openings;
   (d) subjecting the substrate to a first implantation through the implantation mask with dopant ions to form, in the substrate on opposite sides of each gate electrode, a pair of regions with a second type of conductivity separated from one another, and to form, through each of the resistor openings, a resistive region with the second type of conductivity;
   (e) forming a layer of insulating material which covers a structure resulting from steps (a) through (d);
   (f) subjecting the lever of insulating material to anisotropic etching to remove the insulating material until areas of the substrate not covered by the implantation mask are uncovered, and leaving a residue of insulating material along edges of the polycrystalline silicon so as to produce a modified implantation mask;
   (g) subjecting the substrate after step (f) to a second implantation through the modified implantation mask with dopant ions to produce a predetermined surface resistivity for the resistive regions; and
   (h) selectively subjecting the substrate to further implantation of dopant ions.

9. A method according to claim 8, wherein step (g) comprises subjecting the substrate to the second implantation so as not to substantially alter surface resistivities of the regions selectively subjected to the further implantation.

10. A method according to claim 8, wherein step (g) is performed before step (h).

11. A method according to claim 8, wherein the second implantation in step (g) is about $10^{12}$ ions/cm$^2$.

12. A method according to claim 8, wherein the further implantation in step (h) is about $10^{15}$ ions/cm$^2$.

13. A method according to claim 8, further comprising the step of forming on the substrate areas insulated from one another by insulating portions to contain the MOS transistors and the resistors.

14. A method according to claim 13, further comprising the steps of:
   measuring recesses in the insulating portions as a result of the anisotropic etching of step (f); and
   determining the dose and the energy used in step (g) based upon the measuring.

15. A method of manufacturing an integrated circuit comprising MOS transistors and resistors on a substrate of semiconductor material having a first conductivity type, the method comprising the steps of:
   (a) forming a dielectric layer on a substrate defining gate dielectrics of the MOS transistors;
   (b) forming a polycrystalline silicon layer on the dielectric layer;
   (c) selectively removing portions of the polycrystalline layer to define an implantation mask comprising portions of polycrystalline silicon intended to form respective gate electrodes of the MOS transistors and to form portions which define resistor openings;
   (d) subjecting the substrate to a first implantation through the implantation mask with dopant ions to form, in the substrate on opposite sides of each gate electrode, a pair of regions with a second type of conductivity separated from one another, and to form, through each of the resistor openings, a resistive region with the second type of conductivity;

(e) forming a layer of insulating material which covers a structure resulting from steps (a) through (d);

(f) subjecting the layer of insulating material to anisotropic etching to remove the insulating material until areas of the substrate not covered by the implantation mask are uncovered, and leaving a residue of insulating material along edges of the polycrystalline silicon so as to produce a modified implantation mask;

(g) subjecting the substrate after step (f) to a second implantation through the modified implantation mask with dopant ions at a relatively low dose of about $10^{12}$ ions/cm$^2$ to produce a predetermined surface resistivity for the resistive regions; and (h) selectively subjecting the substrate to further implantation of dopant ions at a relatively high dose of about $10^{15}$ ions/cm$^2$.

16. A method according to claim 15, wherein step (g) further comprises subjecting the substrate to the second implantation so as not to substantially alter surface resistivities of the regions selectively subjected to the further implantation.

17. A method according to claim 15, wherein step (g) is performed before step (h).

18. A method according to claim 15, further comprising the step of forming on the substrate areas insulated from one another by insulating portions to contain the MOS transistors and the resistors.

19. A method according to claim 18, further comprising the steps of:

measuring recesses in the insulating portions as a result of the anisotropic etching of step (f); and determining the dose and the energy used in step (g) based upon the measuring.

* * * * *

UNITED STATES PATENT AND TRADEMARK OFFICE
CERTIFICATE OF CORRECTION

PATENT NO. : 6,027,965
DATED : February 22, 2000
INVENTOR(S) : Elena Stucchi, Stefano Daffra, Manlio Sergio Cereda It is certified that error appears in the above-identified patent and that said Letters Patent is hereby corrected as shown below:

| | |
|---|---|
| [75] Inventors Second Line | Strike: "Milan" Insert: --Milano-- |
| [73] Assignee | Strike: "Stmicroelectronics S.r.l." Insert: --STMicroelectronics S.r.l." |
| Column 5, Line 42 | Strike: "subjects" Insert: --subjecting-- |
| Column 5, Line 67 | Strike: ";" Insert: --:-- |
| Column 6, Line 9 | Strike: "resist or" Insert: --resistor-- |

Signed and Sealed this

Twenty-seventh Day of February, 2001

Attest:

NICHOLAS P. GODICI

Attesting Officer

Acting Director of the United States Patent and Trademark Office